United States Patent [19]

Jordan

[11] Patent Number: 4,978,871

[45] Date of Patent: Dec. 18, 1990

[54] LEVEL SHIFT CIRCUIT FOR CONVERTING A SIGNAL REFERENCED TO A POSITIVE VOLTAGE TO A SIGNAL REFERENCED TO A LOWER VOLTAGE

[75] Inventor: E. Perry Jordan, Greensboro, N.C.

[73] Assignee: Analog Devices, Inc., Norwood, Mass.

[21] Appl. No.: 401,065

[22] Filed: Aug. 31, 1989

[51] Int. Cl.[5] .................. H03K 19/082; H03K 19/092
[52] U.S. Cl. .................................... 307/475; 307/455; 307/362
[58] Field of Search ............... 307/443, 455, 456, 475, 307/494, 362, 264, 296.6

[56] References Cited

U.S. PATENT DOCUMENTS

| | | | |
|---|---|---|---|
| 4,607,177 | 8/1986 | Lechner | 307/475 |
| 4,654,549 | 3/1987 | Hannington | 307/475 |
| 4,698,527 | 10/1987 | Matsumoto | 307/455 X |
| 4,736,125 | 4/1988 | Yuen | 307/455 X |
| 4,771,191 | 9/1988 | Estrada | 307/455 X |
| 4,806,800 | 2/1989 | Khan | 307/475 |
| 4,857,776 | 8/1989 | Khan | 307/455 X |
| 4,883,990 | 11/1989 | Umeki | 307/475 X |

OTHER PUBLICATIONS

Z. Melen and H. Garland, *Understanding IC Operational Amplifiers*, 3d Ed., Sams & Co., Inc., 1987, pp. 45–46.
Schematic Diagram, Linear Technology Handbook, pp. 5–36.

*Primary Examiner*—David Hudspeth
*Attorney, Agent, or Firm*—Wolf, Greenfield & Sacks

[57] ABSTRACT

A level shift circuit for converting an input signal referenced to a positive voltage to an output signal referenced to a lower voltage, such as ground. The level shift circuit includes one or more level shift stages and a reference current generator for causing a constant current to be drawn through each level shift stage. Each level shift stage includes a first transistor having a base for receiving the input signal and a collector connected to the positive voltage, a second transistor having an emitter coupled to ground, and a level shift resistor coupled between the emitter of the first transistor and the collector of the second transistor. The output signal from the collector of the second transistor is typically supplied to a TTL output stage. The reference current generator automatically compensates for temperature and power supply variations, so that the output of the level shift circuit tracks the threshold of the TTL output stage.

23 Claims, 3 Drawing Sheets

LEVEL SHIFT CIRCUIT FOR CONVERTING A SIGNAL REFERENCED TO A POSITIVE VOLTAGE TO A SIGNAL REFERENCED TO A LOWER VOLTAGE

FIELD OF THE INVENTION

This invention relates to a level shift circuit and, more particularly, to a level shift circuit that converts a first signal that is referenced to a positive supply voltage to a second signal that is referenced to a lower voltage supply.

BACKGROUND OF THE INVENTION

It is frequently necessary to interconnect different logic families such as emitter-coupled logic (ECL) and transistor-transistor logic (TTL). ECL circuitry may be utilized in an integrated circuit because of its high speed, while the inputs and outputs are required to be TTL compatible. An example of such a circuit is a high speed voltage comparator which utilizes ECL circuitry, but has TTL inputs and outputs. In such integrated circuits, the ECL circuitry is connected to a TTL output stage.

Conventional ECL circuitry is operated from a $-5.2$ volt supply and includes an emitter follower on each output. The ECL circuitry discussed herein is similar to conventional ECL circuitry but is typically operated from a positive five volt supply and does not include emitter followers on outputs. As used hereinafter, the phrase "ECL circuit" refers to such ECL like circuitry.

In many modern TTL circuits, the output stage consists of two distinct paths, a high side path and a low side path. The input voltage to switch the TTL output stage is three diode voltages plus a small additional overdrive across a current limiting resistor, and is referenced to ground. The switching voltage of the TTL output stage varies with temperature. The ECL circuit which drives the TTL output stage provides a signal that is referenced to the positive supply voltage. For example, the ECL circuit may provide an output voltage swing between $+4.2$ volts and $+5.0$ volts. This signal varies with the positive supply voltage and is not at the required level to drive the TTL output stage.

Level shift circuits have been used in the prior art to translate a positive supply-referenced signal to a ground-referenced signal compatible with the TTL output stage. One drawback in prior art level shift circuits has been nonsymmetrical operation. When the level shift circuit provides an output signal and its complement, such circuits have experienced slew rate problems which result in nonsymmetrical outputs and discontinuities, or "glitches", in the outputs. In one prior art circuit, the nonsymmetrical output is alleviated by speedup capacitors. However, the speedup capacitors occupy relatively large areas on the integrated circuit. Furthermore, stray capacitance associated with the speedup capacitors can introduce additional unwanted discontinuities and nonsymmetrical outputs.

It is a general object of the present invention to provide an improved level shift circuit for converting a positive supply referenced signal to a lower voltage-referenced signal.

It is another object of the present invention to provide a level shift circuit which provides symmetrical operation without requiring the use of speedup capacitors.

It is a further object of the present invention to provide a level shift circuit which is simple in construction and low in circuit area.

It is yet another object of the present invention to provide a level shift circuit which provides reliable operation independent of power supply variations.

It is a further object of the present invention to provide a level shift circuit which provides reliable operation independent of temperature variations.

SUMMARY OF THE INVENTION

According to the present invention, these and other objects and advantages are achieved in a level shift circuit for converting a first signal referenced to a first voltage to a second signal referenced to a second voltage lower than the first voltage. The level shift circuit includes at least one level shift stage and reference current means for causing a substantially constant current to be drawn through the level shift stage. The level shift stage comprises a first transistor having a base for receiving the first signal and a collector connected to the first voltage, a second transistor having an emitter coupled to the second voltage, and a level shift resistor having a first terminal coupled to an emitter of the first transistor and a second terminal coupled to a collector of the second transistor. The second signal is supplied from the second terminal of the resistor. The reference current means causes a substantially constant current to be drawn through the first and second transistor and the level shift resistor.

In a preferred embodiment, the reference current means includes a reference transistor having a base connected to the base of the second transistor and an emitter connected to the second voltage. A reference resistor and one or more series-connected pn junctions are coupled between the collector of the reference transistor and the first voltage. The reference transistor and the second transistor form a current mirror in which the current through the second transistor has a predetermined relationship to the current through the reference transistor. The value of the level shift resistor is selected such that the voltage across it added to the base-to-emitter voltage of the first transistor to provide the desired level shift between the first and second signals. The series-connected pn junctions in the reference current means provide temperature compensation of the level of the second signal. The reference current means preferably includes a third transistor having a collector connector to the first voltage, an emitter connected to the base of the reference transistor and a base connected to the collector of the reference transistor.

According to another aspect of the invention, there is provided a level shift circuit for converting a first signal and its complement, both referenced to a first voltage, to a second signal and its complement, both referenced to a second voltage lower than the first voltage. The level shift circuit comprises a first level shift stage for receiving the first signal and providing the second signal, a second level shift stage for receiving the complement of the first signal and providing the complement of the second signal, and reference current means for causing substantially constant currents to be drawn through the first and second level shift stages. Each level shift stage comprises a first transistor having a base for receiving the first signal or the complement of the first signal and a collector connected to the first voltage, a second transistor having an emitter coupled to the second voltage, and a level shift resistor having a first terminal coupled to an emitter of the first transistor and a second terminal coupled to a collector of the second transistor. The second signal or the complement of the second signal is supplied from the second terminal of the level shift resistor. Each level shift stage operates as described above.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

Figure 1:
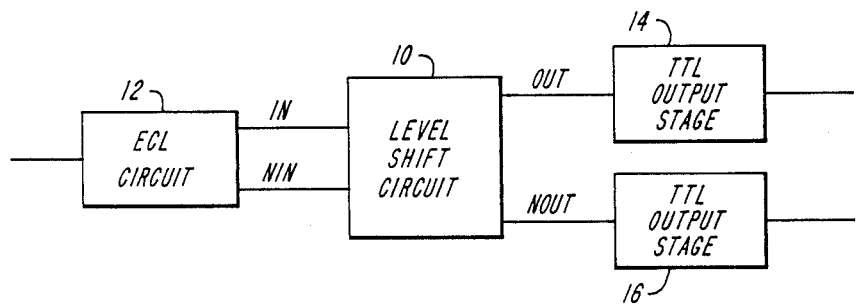
FIG. 1 is a block diagram showing the connection of a level shift circuit in an integrated circuit.

A block diagram showing the application of a level shift circuit in an integrated circuit is shown in FIG. 1. Only a portion of the complete integrated circuit is shown. A level shift circuit 10 receives inputs from an ECL circuit 12 and provides output signals to TTL output stages 14 and 16. The ECL circuit 12 may, for example, be a high speed comparator which provides an input signal IN and the complement of the input signal NIN to the level shift circuit 10. The signals from the ECL circuit 12 are referenced to a positive voltage supply, such as +5 volts. The signals may, for example, swing between 4.2 volts in one logic state, and 5.0 volts in the other logic state. The level shift circuit 10 provides an output signal OUT to the TTL output stage 14 and the complement signal NOUT to the TTL output stage 16. The output signals OUT and NOUT are referenced to a second voltage that is lower than the positive supply voltage. Typically, the output signals are referenced to ground.

Figure 2:
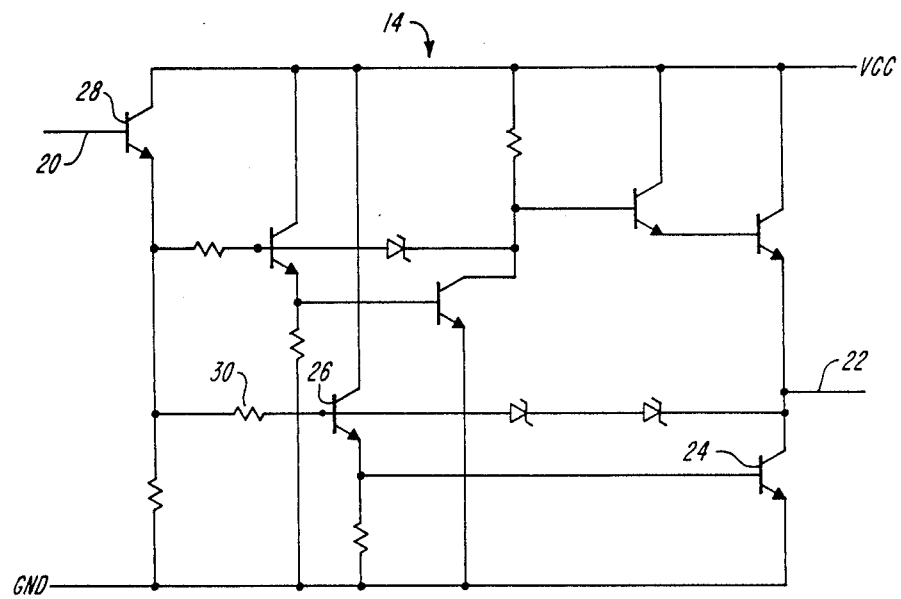
FIG. 2 is a schematic diagram of a conventional TTL output stage.

A schematic diagram of the TTL output stage 14 is shown in FIG. 2. The output stage 16 is identical. An input signal on line 20 must reliably switch the output on line 22. Output stage transistor 24 turns on fully when the input voltage on line 20 is at least three base-to-emitter junction voltages above ground. The input voltage must turn on transistors 24, 26 and 28. Assuming that the base-to-emitter voltage for each transistor is 0.8 volt, the TTL output stage 14 switches at an input threshold voltage of 2.4 volts. When the input voltage is above 2.4 volts, the additional voltage is dropped across resistor 30. When the input voltage is below 2.4 volts, the TTL output stage 14 is cut off. When the input voltage has a sufficient swing above and below 2.4 volts, the TTL output stage 14 operates properly. The input threshold voltage of 2.4 volts is referenced to ground. It will be recognized that the input threshold voltage varies with temperature. More specifically, the required input threshold voltage decreases at high temperatures and increases at low temperature due to variations in the base-to-emitter voltages, $V_{be}$, of transistors 24, 26 and 28.

Figure 3:
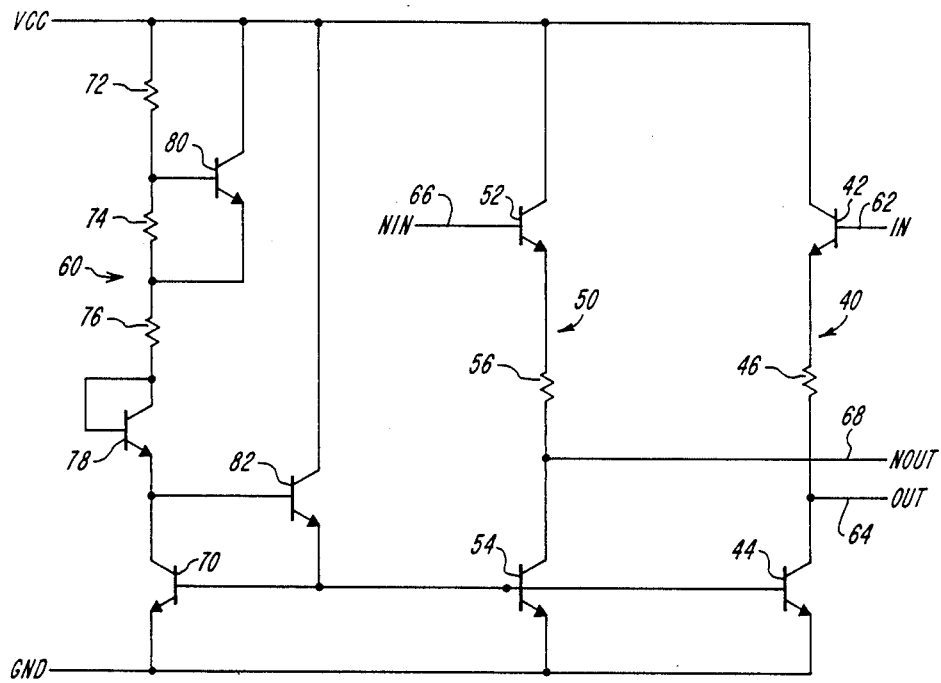
FIG. 3 is a schematic diagram of a level shift circuit in accordance with the present invention.

A level shift circuit in accordance with the present invention is shown in FIG. 3. A first level shift stage 40 includes transistors 42 and 44 and level shift resistor 46. A second level shift stage 50 includes transistors 52 and 54 and level shift resistor 56. A reference current generator 60 generates a reference current for level shift stages 40 and 50, as described hereinafter. The level shift stage 40 receives an input signal IN on a line 62 and provides an output signal OUT on a line 64. The level shift stage 50 receives an input signal NIN on a line 66 and provides an output signal NOUT on a line 68. The input signals on lines 62 and 66 are referenced to a positive supply voltage VCC, and the output signals on lines 64 and 68 are referenced to ground.

The input signal on line 62 is coupled to the base of transistor 42. The collector of transistor 42 is coupled to the positive supply voltage VCC. The emitter of transistor 42 is coupled through level shift resistor 46 to the collector of transistor 44. The output line 64 is also connected to the collector of transistor 44. The emitter of transistor 44 is connected to ground.

The input signal line 66 is connected to the base of transistor 52. The collector of transistor 52 is connected to the positive supply voltage VCC. The emitter of transistor 52 is connected through level shift resistor 56 to the collector of transistor 54. The output line 68 is also connected to the collector of transistor 54. The emitter of transistor 54 is connected to ground. The bases of transistors 44 and 54 are connected to the reference current generator 60.

The reference current generator 60 includes a reference transistor 70. Resistors 72, 74 and 76 and diode 78 are connected in series between the positive supply voltage VCC and the collector of transistor 70. A transistor 80 has a collector connected to the positive supply voltage VCC, a base connected to the junction of resistors 72 and 74 and an emitter connected to the junction of resistors 74 and 76. A transistor 82 has a collector connected to the positive supply voltage VCC, a base connected to the collector of transistor 70 and an emitter connected to the base of transistor 70. The bases of transistors 54 and 44 are connected to the base of transistor 70.

The operation of the level shift circuit of FIG. 3 is explained as follows. The reference current generator 60 establishes a constant current through reference transistor 70, except for changes caused by temperature and power supply variations. The transistors 54 and 44 are connected in a current mirror configuration with transistor 70. That is, since the transistor 44, 54 and 70 are connected so as to have the same base to emitter voltage and are constructed on the same integrated circuit, the collector currents have a predetermined ratio depending on the geometries of each transistor. For example, when the transistors 44, 54 and 70 have the same geometry, they have equal collector currents in the circuit of FIG. 3. Therefore, the currents through level shift stages 40 and 50 are substantially constant currents established by reference current generator 60. The currents remain the same regardless of the states of the input signals applied to stages 40 and 50.

The current in the reference current generator 60 is determined as follows. The anode of diode 78 is three base-to-emitter voltages above ground, since transistors 70 and 82 and diode 78 each contribute one base to emitter voltage. Preferably, the value of resistor 74 is twice the value of resistor 72. For these values, it can be shown that the total voltage drop across resistors 72 and 74 is 1.5 base-to-emitter voltages. Thus, the reference current is calculated as $(V_{CC}-4.5V_{be})/($resistor 76$)$. Assuming that the supply voltage is 5 volts, and that $V_{be}$ is 0.8 volt, this expression reduces to 1.4 volts divided by the value of resistor 76. In an example of the level shift circuit, the reference current is 1.4 milliamps. However, the value of the reference current is not critical.

Assuming that the transistors 44, 54 and 70 are fabricated to carry equal currents for equal base-to-emitter voltages, and that resistors 46, 56 and 76 have equal values, the voltage drops across resistors 46, 56 and 76 are equal. It will be understood that the transistors 44, 54 and 70 can be fabricated to provide different currents and that resistors 46, 56 and 76 are not necessarily equal. However, in any case the currents through level shift stages 40 and 50 remain at a constant level which is determined by reference current generator 60. In a preferred embodiment, transistors 44, 54 and 70 are fabricated such that the current through each of transistors 44 and 54 is twice the current through transistor 70, and each of the resistors 46 and 56 is one half the value of resistor 76. In this embodiment, the voltages drops across resistors 46, 56 and 76 are equal.

Operation of the level shift circuit with input signals is now described with reference to FIG. 3A which illustrates examples of input and output waveforms. The input signal IN, as indicated by waveform 102, is applied to input line 62, and the complement of the input signal NIN, as indicated by waveform 104, is applied to input line 66. The waveforms 102 and 104 are ECL logic signals which swing between +4.2 volts and +5 volts. Assume that the reference current generator 60 establishes voltage drops of 1.4 volts across each of resistors 46 and 56. Further assuming that the base-to-emitter voltages of transistors 42 and 52 are 0.8 volts, it can be seen that the output of each level shift stage swings between +2.8 volts and +2.0 volts.

Figure 3A:
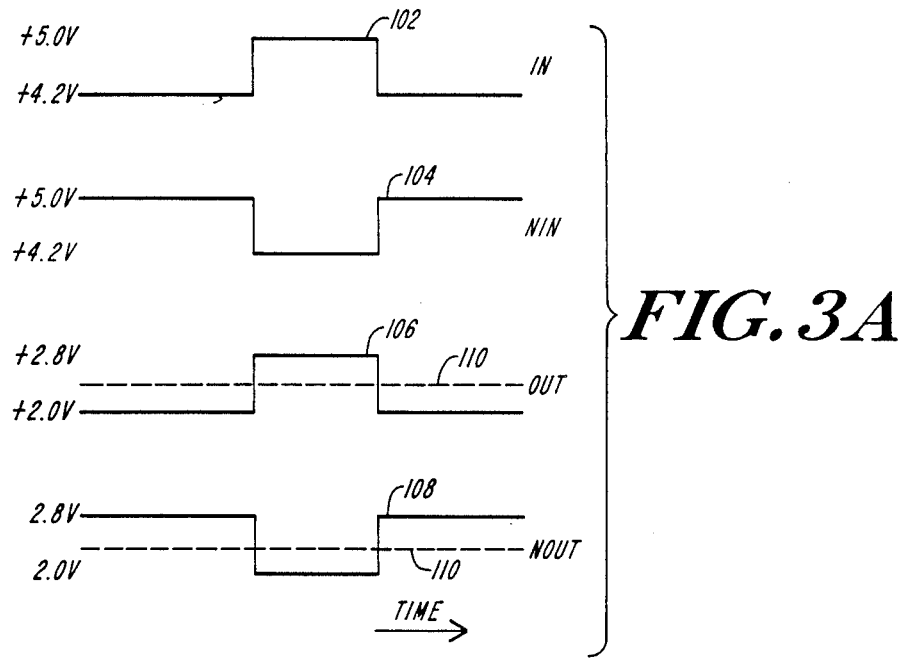
FIG. 3A is a graphic representation of voltage waveforms in the level shift circuit of FIG. 3.

More specifically, input waveform 102 applied to level shift stage 40 produces an output signal OUT on output line 64, as indicated by waveform 106 in FIG. 3A. Similarly, input waveform 104 applied to level shift stage 50 produces a output signal NOUT output line 68, as indicated by waveform 108 in FIG. 3A. The threshold voltage of the TTL output stage 14, typically 2.4 volts at room temperature, is indicated by dashed lines 110 with respect to waveforms 106 and 108. The level shift circuit outputs swing above and below the threshold 110 by approximately 400 millivolts. Furthermore, since the transistors of the level shift stages 40 and 50 are not required to turn on or off during operation, the "glitches" associated with the operation of prior art level shift circuits are eliminated without requiring the use of speedup capacitors.

The level shift circuit of FIG. 3 automatically compensates for variations in temperature and power supply voltage. As discussed above, the switching or threshold voltage of the TTL output stage 14 is typically 2.4 volts at room temperature. However, the base-to-emitter junction voltages which determine the threshold voltage vary with temperature. More specifically, the threshold voltage drops at high temperatures due to a decrease in the base-to-emitter voltages, and the threshold voltage increases at low temperatures due to an increase in base-to-emitter voltages.

As discussed previously, the reference current generator 60 includes the equivalent of 4.5 base-to-emitter junction voltages $V_{be}$, which corresponds to three base-to-emitter junction voltages in the TTL output stage (transistors 24, 26 and 28), one base to emitter junction voltage in the level shift stage (transistor 42 or 52) and approximately one-half of a base-to-emitter junction voltage drop across the resistor 30 in TTL output stage 14. When the temperature increases, the voltage across the 4.5 base to emitter junctions in reference current generator 60 decreases, thereby increasing the voltage across resistor 76. Since the voltages across resistors 46 and 56 are equal to (or in a predetermined ratio to) the voltage across resistor 76, the voltages across resistors 46 and 56 increase. The increased voltages across resistors 6 and 56 shift the outputs of the level shift circuit down to the lower level required by the input of the TTL stage. For example, if $V_{be}$ drops from 0.8 volt to 0.7 volts, the threshold voltage of TTL output stage 14 drops to 2.1 volts, and the output of the level shift circuit swings between 1.65 volts and 2.45 volts.

Similarly, when the temperature decreases, the voltage across the 4.5 base-to-emitter junctions in reference current generator 60 increases, thereby decreasing the voltage across resistor 76. The decreased voltage across resistor 76 is reflected by the current mirror arrangement to resistors 46 and 56 so that the voltages across these resistors decrease. Reduced voltages across resistors 46 and 56 increases the output level of the level shift circuit to compensate for the decreased temperature. For example, if $V_{be}$ increases from 0.8 to 0.9 volts, the threshold voltage of output stage 14 increases to 2.7 volts. The output of the level shift circuit swings between 2.45 volts and 3.25 volts.

The level shift circuit shown in FIG. 3 also compensates for power supply variations. When the supply voltage VCC decreases, the voltage across resistors 76, 46 and 56 is reduced, thereby keeping the output level of the circuit relatively constant.

The level shift circuit shown in FIG. 3 and described hereinabove includes identical level shift stages 40 and 50 for complementary operation. It will be understood that one of the level shift stages 40, 50 can be eliminated in cases where complementary signals are not utilized. Thus, for example, transistors 52 and 54 and resistor 56 can be eliminated from the circuit of FIG. 3 to provide a single level shift stage 40.

Figure 4:
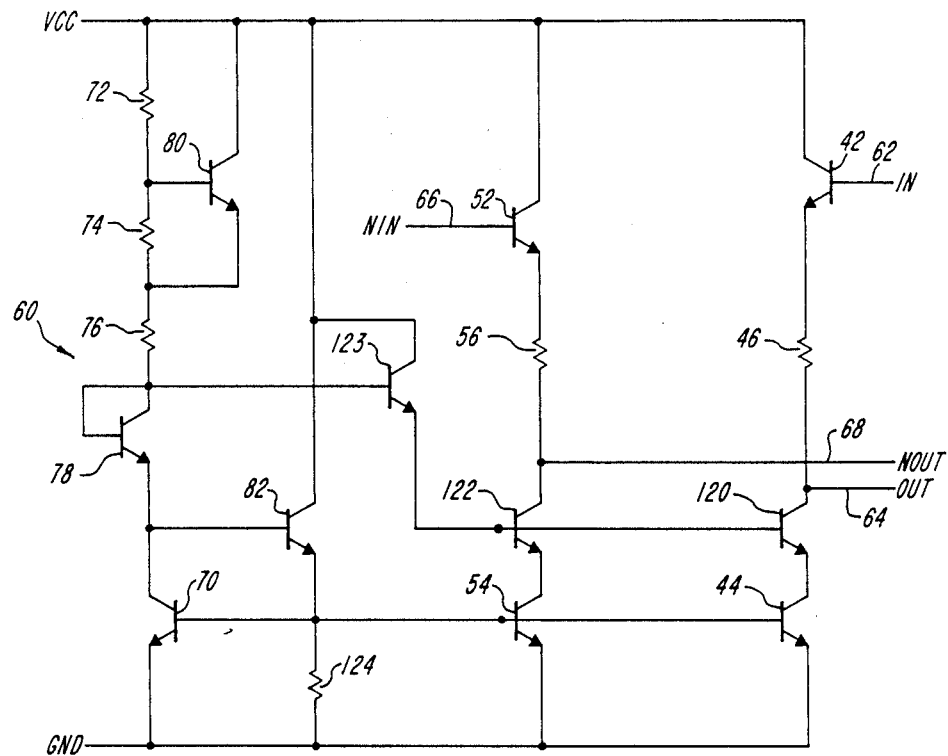
FIG. 4 is a schematic diagram of a level shift circuit in accordance with another embodiment of the invention.

A variation of the level shift circuit is shown in FIG. 4. Components corresponding to those in the circuit of FIG. 3 have the same reference numerals. The circuit of FIG. 4 differs from the circuit of FIG. 3 by the presence of cascode transistors 120 and 122, emitter follower transistor 123 and resistor 124. The resistor 124 is coupled between the emitter of transistor 82 and ground. The purpose of resistor 124 is to increase the collector current of transistor 82 and thereby increase its operating speed. The resistor 124 can be utilized in the circuit of FIG. 3 if desired.

The cascode transistor 120 is connected in series between resistor 46 and transistor 44. The collector of transistor 120 is connected to resistor 46, and the emitter of transistor 120 is connected to the collector of transistor 44. The output line 64 of the level shift stage is connected to the collector of transistor 120. Similarly, transistor 122 is connected in series between resistor 56 and transistor 54. The collector of transistor 122 is connected to resistor 56, and the emitter of transistor 122 is connected to the collector of transistor 54. The output line 68 of the level shift circuit is connected to the collector of transistor 122. The bases of transistors 120 and 122 are connected to the emitter of transistor 123. The base of transistor 123 is connected to the anode of diode 78, and the collector of transistor 123 is connected to the positive supply voltage VCC. Alternatively, transistor 123 can be omitted, and the bases of transistors 120 and 122 can be connected to the base of transistor 82. The transistors 120 and 122 improve the operation of the current mirror formed by transistors 44, 54 and 70. However, a disadvantage of the configuration shown in FIG. 4 is that the allowable swing in input voltages to the level shift circuit is decreased by the presence of transistors 120 and 122.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A level shift circuit for converting a first signal referenced to a first voltage to a second signal referenced to a second voltage lower than the first voltage, said circuit comprising:
   a first transistor having a base for receiving the first signal and a collector connected to the first voltage;
   a second transistor having an emitter coupled to the second voltage;
   a level shift resistor having a first terminal coupled to an emitter of the first transistor and a second terminal coupled to a collector of the second transistor, the second signal being supplied from the second terminal of said level shift resistor; and
   reference current means for causing a substantially constant current to be drawn through said first and second transistors and said level shift resistor, said reference current means including a reference transistor having a base connected to a base of said second transistor and an emitter connected to the second voltage.

2. A level shift circuit as defined in claim 1 wherein said reference current means further includes a reference resistor coupled in series with the collector of the reference transistor.

3. A level shift circuit as defined in claim 2 wherein said reference resistor and said level shift resistor are selected such that the voltages thereacross are approximately equal.

4. A level shift circuit as defined in claim 2 wherein said reference current means further includes a third transistor having a collector connected to the first voltage, an emitter connected to the base of the reference transistor and a base connected to the collector of the reference transistor.

5. A level shift circuit as defined in claim 2 wherein said reference transistor and said second transistor are fabricated such that equal base-to-emitter voltages provide a predetermined ratio of collector currents.

6. A level shift circuit as defined in claim 4 wherein said reference current means further includes a bias resistor connected between the base of said reference transistor and the second voltage.

7. A level shift circuit as defined in claim 4 further including a cascode transistor coupled in series between the second terminal of said level shift resistor and the collector of said second transistor.

8. A level shift circuit as defined in claim 4 wherein said reference current means further includes a diode connected in series with said reference resistor and said reference transistor.

9. A level shift circuit as defined in claim 2 wherein said reference current means includes a predetermined number of pn junctions coupled in series with said reference resistor.

10. A level shift circuit as defined in claim 2 wherein said reference current means includes the equivalent of 4.5 base-to-emitter junctions coupled in series with said reference resistor.

11. A level shift circuit as defined in claim 1 wherein the first voltage is a positive voltage supply, and the second voltage is ground.

12. A level shift circuit for converting a first signal and its complement, both referenced to a first voltage, to a second signal and its complement, both referenced to a second voltage lower than the first voltage, said circuit comprising:
    a first level shift stage for receiving the first signal and providing the second signal;
    a second level shift stage for receiving the complement of the first signal and providing the complement of the second signal, each level shift stage comprising
    a first transistor having a base for receiving the first signal or the complement of the first signal and a collector connected to the first voltage,
    a second transistor having an emitter coupled to the second voltage, and a base, and
    a level shift resistor having a first terminal coupled to an emitter of the first transistor and a second terminal coupled to a collector of the second transistor, the second signal or the complement of the second signal being supplied from the second terminal of said level shift resistor; and
    reference current means for causing substantially constant currents to be drawn through said first and second level shift stages, said reference current means being connected to the base of the second transistor of each shift stage.

13. A level shift circuit as defined in claim 12 wherein said reference current means includes a reference transistor having a base connected to a base of the second transistor of each of said first and second level shift stages, and an emitter connected to the second voltage.

14. A level shift circuit as defined in claim 13 wherein said reference current means further includes a reference resistor coupled in series with the collector of the reference transistor.

15. A level shift circuit as defined in claim 14 wherein said reference resistor and the level shift resistor in each of said first and second level shift stages are selected such that the voltages thereacross are approximately equal.

16. A level shift circuit as defined in claim 14 wherein said reference current means further includes a third transistor having a collector connected to the first voltage, an emitter connected to the base of the reference transistor and a base connected to the collector of the reference transistor.

17. A level shift circuit as defined in claim 14 wherein said reference transistor and the second transistor in each of said first and second level shift stages are fabricated such that equal base-to-emitter voltages provide a predetermined ratio of collector currents.

18. A level shift circuit as defined in claim 16 wherein said reference current means further includes a bias resistor connected between the base of said reference transistor and the second voltage.

19. A level shift circuit as defined in claim 16 wherein each of said first and second level shift stages further includes a cascode transistor coupled in series between the second terminal of said level shift resistor and the collector of said second transistor.

20. A level shift circuit as defined in claim 16 wherein said reference current means further includes a diode connected in series with said reference resistor and said reference transistor.

21. A level shift circuit as defined in claim 14 wherein said reference current means includes a predetermined number of pn junctions coupled in series with said reference resistor.

22. A level shift circuit as defined in claim 14 wherein said reference current means includes the equivalent of 4.5 base-to-emitter junctions coupled in series with said reference resistor.

23. A level shift circuit as defined in claim 12 wherein the first voltage is a positive voltage supply, and the second voltage is ground.

* * * * *